(12) United States Patent
Amblard

(10) Patent No.: US 6,764,946 B1
(45) Date of Patent: Jul. 20, 2004

(54) METHOD OF CONTROLLING LINE EDGE ROUGHNESS IN RESIST FILMS

(75) Inventor: Gilles Amblard, San Jose, CA (US)

(73) Assignee: Advanced Micro Devices, Inc., Sunnyvale, CA (US)

(*) Notice: Subject to any disclaimer, the term of this patent is extended or adjusted under 35 U.S.C. 154(b) by 0 days.

(21) Appl. No.: 10/676,911

(22) Filed: Oct. 1, 2003

(51) Int. Cl.[7] .......................................... H01L 21/4763
(52) U.S. Cl. ........................ 438/637; 438/737; 438/947
(58) Field of Search ................................. 438/637, 671, 438/694, 708, 765, 737, 947, 717, 942

(56) References Cited

U.S. PATENT DOCUMENTS

| | | | |
|---|---|---|---|
| 6,174,818 B1 * | 1/2001 | Tao et al. ................ | 438/733 |
| 6,486,058 B1 | 11/2002 | Chun | |
| 6,514,672 B2 * | 2/2003 | Young et al. ............ | 430/314 |
| 2003/0027080 A1 | 2/2003 | Lu | |

FOREIGN PATENT DOCUMENTS

TW    19990122188    12/1999

OTHER PUBLICATIONS

Toyoshima, et al, 0.1 $\mu$m Level Contact Hole Pattern Formation with KrF Lithography by Resolution Enhancement Lithography Assisted by Chemical Shrink (RELACS), IEEE 1998, IEDM 98–333, pp. 12.5.1–12.5.4.

RELACS Resolution Enhancement Lithography Assisted by Chemical Shrink AZ R500, Pure D.I. Water Developable RELACS Coating, Updated on Jun. 28, 2002, Version 05. Clariant Japan K.K., BU Electronic Materials.

* cited by examiner

Primary Examiner—Phuc T. Dang
(74) Attorney, Agent, or Firm—Renner, Otto, Boisselle & Sklar, LLP

(57) ABSTRACT

Disclosed is a method of forming an integrated circuit line on a wafer using a lithographic technique. The method can include forming a photo resist line having a line width smaller than a desired line width of the integrated circuit line. The photo resist line can be reacted with a coating to form a mask line having a line width corresponding to the desired line width of the integrated circuit line and with a smaller line edge roughness (LER) than of the photo resist line.

14 Claims, 2 Drawing Sheets

METHOD OF CONTROLLING LINE EDGE ROUGHNESS IN RESIST FILMS

TECHNICAL FIELD

The present invention relates generally to the field of integrated circuit manufacture and, more particularly, to a method of reducing the prominence of line edge roughness in a photo resist line and then, subsequently, in a layer to be etched that underlies the photo resist line.

BACKGROUND

The formation of various integrated circuit (IC) structures on a wafer often relies on lithographic processes, sometimes referred to as photolithography, or simply lithography. For instance, patterns can be formed from a photo resist layer by passing light energy through a mask (or reticle) having an arrangement to image the desired pattern onto the photo resist layer. As a result, the pattern is transferred to the photo resist layer. In areas where the photo resist is sufficiently exposed and after a development cycle, the photo resist material can become soluble such that it can be removed to selectively expose an underlying layer (e.g., a semiconductor layer, a metal or metal containing layer, a dielectric layer, etc.). Portions of the photo resist layer not exposed to a threshold amount of light energy will not be removed and serve to protect the underlying layer. The exposed portions of the underlying layer can then be etched (e.g., by using a chemical wet etch or a dry reactive ion etch (RIE)) such that the pattern formed from the photo resist layer is transferred to the underlying layer. Alternatively, the photo resist layer can be used to block dopant implantation into the protected portions of the underlying layer or to retard reaction of the protected portions of the underlying layer. Thereafter, the remaining portions of the photo resist layer can be stripped.

There is a pervasive trend in the art of IC fabrication to increase the density with which various structures are arranged. As a result, there is a corresponding need to increase the resolution capability of lithography systems. To accomplish this goal, relatively short wavelengths (e.g., less than about 258 nm) have been used for the illumination light source. In conjunction with these relatively short wavelengths, ultra thin resists (UTR) have been used. For example, many applications include the use of photo resist layers that have a thickness of about 0.1 micron or thinner.

As the critical dimension (CD) of lines formed using UTRs becomes smaller (e.g., about 0.25 microns and smaller), line edge roughness (LER) of the lines increases. In some instances, LER becomes significant enough to effect device performance and lead to unacceptable ICs formed on the wafer. For example, 0.18 micron lines formed using conventional lithographic techniques will tend to have noticeable LER, 0.12 to 0.13 micron lines will tend to exhibit significant LER, 0.10 micron lines will tend to have very poor LER and 0.06 micron lines will tend to have an extremely poor LER.

Accordingly, there exists a need in the art for improved lithography process techniques to control LER.

SUMMARY OF THE INVENTION

According to one aspect of the invention, the invention is directed to a method of forming an integrated circuit line on a wafer using a lithographic technique. The method can includes providing the wafer, the wafer including a substrate and, over the substrate, each of a photo resist layer and an underlying layer to be processed under the photo resist layer; exposing and developing the photo resist layer to form a photo resist line, the photo resist line having a line width smaller than a desired line width of the integrated circuit line; coating the photo resist line with a reactive coating; and reacting the photo resist line with the coating to form a mask line having a line width corresponding to the desired line width of the integrated circuit line and with a smaller line edge roughness (LER) than of the photo resist line.

BRIEF DESCRIPTION OF DRAWINGS

These and further features of the present invention will be apparent with reference to the following description and drawings, wherein.

DISCLOSURE OF INVENTION

Figure 1:
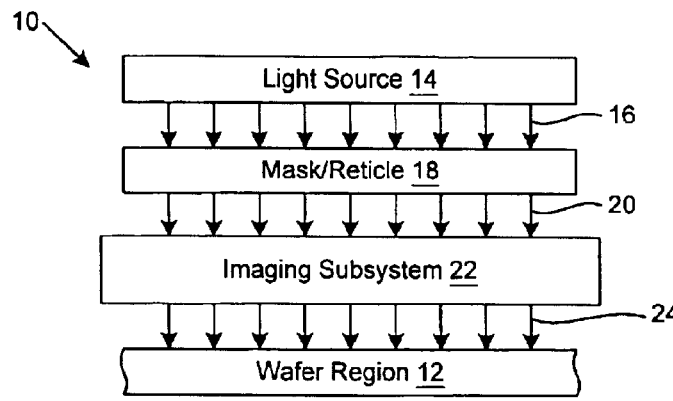
FIG. 1 is a schematic block diagram of an example integrated circuit (IC) processing arrangement.

In the detailed description that follows, corresponding components have been given the same reference numerals, regardless of whether they are shown in different embodiments or views of the inventions described herein. To illustrate the various aspects of the inventions in a clear and concise manner, the drawings may not necessarily be to scale and certain features may be shown in somewhat schematic form.

The description herein is presented in the exemplary context of fabricating a wafer having an integrated circuit (IC) formed thereon. Example ICs include general purpose microprocessors and/or logic circuits made from thousands or millions of transistors, a flash memory array or any other dedicated circuitry. However, one skilled in the art will appreciate that the methods and devices described herein can also be applied to the fabrication of any article manufactured using lithography, such as micromachines, disk drive heads, gene chips, micro electro-mechanical systems (MEMS) and so forth.

The apparatus and methods described herein can be used to improve line edge roughness (LER) in components of an IC. Improvements in LER result from printing photo resist lines with a smaller than desired line width for components derived from a layer underlying the photo resist layer. The photo resist lines also may have a higher than desired LER. The photo resist lines are reacted with a shrink coating to achieve the target line width as well as improve the LER of the photo resist lines. When the underlying layer is etched using the photo resist lines as a mask to form corresponding lines in the underlying layer, those underlying layer lines can have a corresponding improvement in LER.

Referring to FIG. 1, illustrated is a schematic block diagram of an exemplary IC processing arrangement that includes a lithography system 10 used to image a pattern onto a wafer 12, or a region thereof. The system 10 can be, for example, a step-and-repeat exposure system or a step-and-scan exposure system, but is not limited to these example systems. The system 10 can include a light source 14 for directing light energy or other radiation 16 towards a mask 18 (sometimes referred to as a reticle). The light energy 16 can have, for example, a deep ultraviolet (DUV) wavelength (e.g., about 248 nm or about 193 nm), a vacuum ultraviolet (VUV) wavelength (e.g., about 157 nm), or an extreme ultraviolet (EUV) wavelength (e.g., about 13.4 nm).

The mask 18 selectively blocks light energy 16 such that a light energy pattern 20 defined by the mask 18 is transferred towards the wafer 12. An imaging subsystem 22, such as a stepper assembly or a scanner assembly, sequentially directs the energy pattern 20 transmitted by the mask 18 to a series of desired locations on the wafer 12. The imaging subsystem 22 may include a series of lenses and/or reflectors for use in scaling and directing the energy pattern 20 towards the wafer 12 in the form of an imaging (or exposure) light energy pattern 24.

Figure 2:
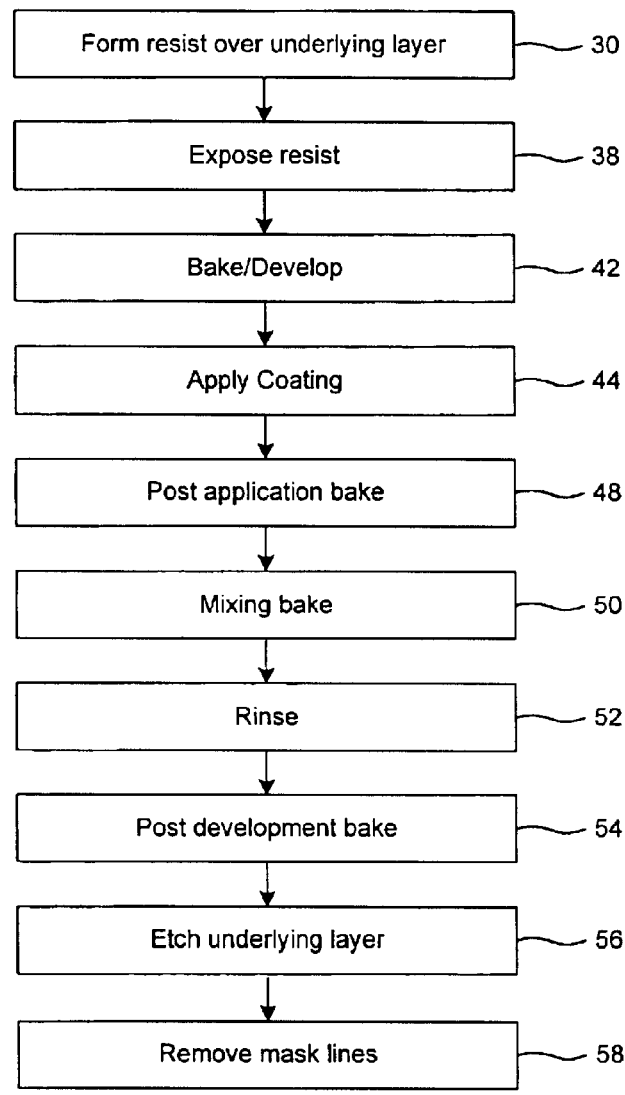
FIG. 2 is a flow diagram illustrating an example embodiment of a method of processing a wafer in accordance with the present invention.
Figure 3:
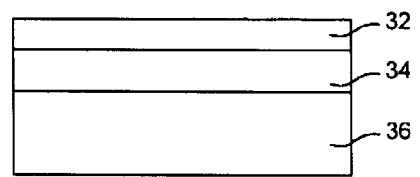
FIG. 3 is a partial cross-section of an example wafer at a certain point during processing of the wafer using the method.

With additional reference to FIG. 2, illustrated is a flow diagram illustrating an example embodiment of a method of processing the wafer 12 in accordance with certain aspects of the present invention. With additional reference to FIGS. 3 through 8, the method can be used to establish mask lines 26 (FIGS. 5 and 6) with relatively low LER. The mask lines 26 can be disposed over a layer to be processed for use in protecting portions of the layer to be processed. Upon etching of the layer to be processed, the mask lines 26 can define formation of underlying layer lines 28 (FIGS. 7 and 8) and the relatively low LER of the mask lines 26 can be transferred to the underlying layer lines 28. The underlying layer lines 28 will also be referred to herein as integrated circuit lines.

The method can start in block 30 where a photo resist layer 32 can be formed over a layer to be processed. Since the photo resist layer 32 is formed over the layer to be processed and the layer to processed underlies the photo resist layer 32, the layer to be processed will be referred to herein as an underlying layer 34.

Photo resist materials are relatively well known in the art and will not be described in great detail. Any suitable photo resist material can be selected for the photo resist layer 32 and can include organic materials and/or chemically amplified resist materials. It is noted that the photo resist material should be selected to be compatible with an illumination wavelength and a shrink coating material, as described in greater detail below. An example suitable photo resist material is available under the designation "AZ DX5220P (Acetal Type)" by Clariant International, Ltd., Rothausstrasse 61, CH-4132 Muttenz, Switzerland. In one embodiment, the photo resist layer 32 can be an ultra-thin resist (UTR), such as a resist having a thickness of about 0.1 microns or thinner.

Other materials and/or treatments can be disposed between the photo resist layer 32 and the underlying layer 34, including, for example, a primer, a bottom anti-reflective coating (BARC) layer, and so forth. An example suitable BARC material is available under the designation "AZ KrF-17B" by Clariant International, Ltd., Rothausstrasse 61, CH-4132 Muttenz, Switzerland.

The underlying layer 34 can be formed over a substrate 36, such as a bulk semiconductor substrate and a semiconductor-on-insulator (SOI) substrate. Although not illustrated, the wafer 12 can include any number of additional intermediate layers on the substrate 36, such as previously processed layers and/or previously formed layers (including patterned and/or unpatterned layers). The intermediate layers can include, for example, the selective or non-selective implantation of dopant species to form P type and/or N type wells as well as P type and/or N type conductive regions used as source and drain regions for various devices of the IC. The intermediate layers can also include the formation of isolation regions in the substrate 36. In addition, one or more dielectric layers, contact layers, inter-dielectric layers, gate electrode layers, passivation layers, active regions and so forth can be formed. Therefore, the underlying layer 34 can be disposed over the substrate 36 and any other intermediate layers that happen to be present in or on the substrate 36.

In one example, the underlying layer 34 is a polysilicon or metal layer that will be patterned into a plurality of lines for use as, for example, gate electrodes or addressable word lines. As should be appreciated, the layer to be processed can be formed from other materials and/or can be used to fabricate other types of structures, including structures for inclusion in a final device, dummy structures and/or hard mask layer structures.

Figure 4:
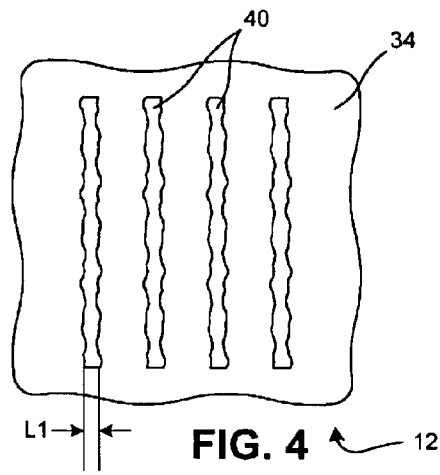
FIG. 4 is a schematic top view illustration of a portion of the example wafer at a certain point during processing of the wafer.

The method can continue in block 38 where the photo resist layer 32 is exposed to the exposure pattern 24 (FIG. 1). In one embodiment, the pattern of the reticle 18 is arranged to result in the formation of an array of photo resist lines 40 (FIG. 4). In one embodiment, the critical dimension of the photo resist lines 40 can be 0.25 microns or less and can have any suitable pitch, such as about 1:1 to about 1:10.

The method can continue in block 42 where the wafer 12 is subjected to a post exposure (PE) bake. PE bake cycles are relatively well known in the art and will not be discussed in great detail. In one embodiment, and depending on the photo resist material used, the wafer 12 can be subjected to a temperature of about 100 degrees Celsius (C) to about 130 degrees C. for about sixty seconds to about ninety seconds.

Thereafter, also in block 42, the wafer 12 can be developed to remove portions of the photo resist layer 32 that were exposed in block 38. The developer will depend on the photo resist material used. In one embodiment, a suitable developer is available under the designation "AZ 300MIF" from Clariant International, Ltd., Rothausstrasse 61, CH-4132 Muttenz, Switzerland. In one embodiment, the development time can range from about twenty seconds to about sixty seconds.

Following block 42, the photo resist layer 32 can be considered patterned to include the photo resist lines 40. Other structures may also be formed from the photo resist layer 32 but, for simplicity of the drawing figures, these structures have not been illustrated. In one embodiment, the photo resist lines 40 can be formed to have an initial critical dimension (L1 in FIG. 4) of 0.25 microns or less. However, depending on how the corresponding components of the underlying layer 34 will be used, the photo resist lines 40 have a critical dimension L1 larger than 0.25 microns (e.g., about 0.25 microns to tens of microns).

As illustrated, the photo resist lines 40 can exhibit a relatively large LER. Although the LER of the drawing figures attached hereto may be somewhat exaggerated, the LER of photo resist lines 40 made from an UTR photo resist material layer 32 can have an undesirable amount of LER, especially in situations where the critical dimension of the photo resist lines 40 is less than 0.25 microns.

The exposed surfaces of the photo resist lines 40 form exposure interface surfaces, which can include the side walls of the photo resist lines 40 and the upper surfaces of the photo resist lines 40. The exposure interface surfaces are those portions of the photo resist layer 32 that were either directly exposed to some light energy of the exposure pattern 24 or immediately adjacent portions of the photo resist layer 32 that were exposed to light energy of the exposure pattern 24.

Figure 5:
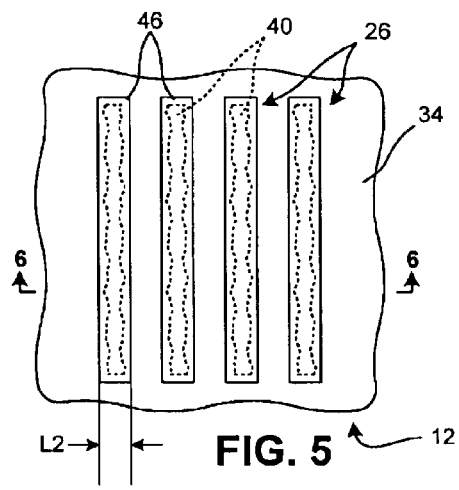
FIG. 5 is a schematic top view illustration of the wafer portion during another point of the wafer processing.
Figure 6:
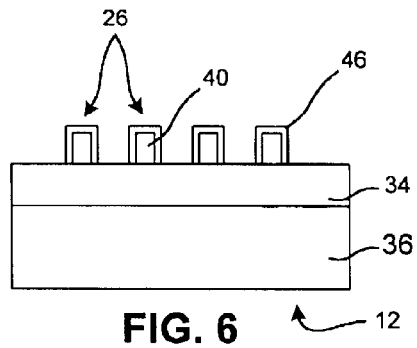
FIG. 6 is a cross-section taken along the line 6—6 of FIG. 5.

With continuing reference to FIGS. 2, 5 and 6, the method can continue in block 44 by applying a coating 46 on the developed photo resist lines 40. In one embodiment, the coating 46 is spun on such that at least the side walls of the photo resist lines 40 are coated. As will be described in greater detail below, the photo resist lines 40 can be increased in line width by reaction of the coating 46 and the photo resist material. As should be appreciated, the coating 46 may also be applied to the upper surface of the photo resist lines 40, as well as any other surfaces of the photo resist material and/or the underlying layer 34 that are exposed at the beginning of block 44. In one embodiment, the coating 46 may be deposited to a thickness of about 0.35 microns and/or can form a conformal layer over exposed portions of the underlying layer 34 and the photo resist material remaining after block 42.

The coating 46 preferably has the ability to react with at least the exposure interface surfaces of the photo resist material to increase the line width of the photo resist lines 40 by forming an extra layer of material integral with the photo resist lines 40. Together, the photo resist lines 40 and the reacted additional material can form the mask lines 26. The coating 46 can be, for example, an organic, spin-on shrink coating. In one embodiment, the coating 46 is a water-soluble polymer and cross-linker. Although the composition of the coating 46 will be depend on the photo resist material, suitable shrink coatings are available from Clariant International, Ltd., Rothausstrasse 61, CH-4132 Muttenz, Switzerland under the designation RELACS, which is an acronym for resolution enhancement lithography assisted by chemical shrink. One such suitable RELACS coating available from Clariant is designated "AZ R500." Another example suitable shrink coating in available from Tokyo Ohka Kogyo Co., Ltd. (or TOK) of 150 Nakamaruko, Nakahara-ku, Kawasaki, 211-0012, Japan under the designation SAFIER. These shrink type coatings are primarily designed to shrink contact holes formed in photo resist material after patterning/development of the photo resist material.

After the coating 46 has been applied in block 44, the method can continue in block 48. In block 48, the wafer 12 is subjected to a post coating application bake intended to assist in drying the coating 46. In one example, the post application bake can be carried out at a temperature of about 85 degrees C. for about 70 seconds. Thereafter, the coating 46 and the photo resist material can be reacted using, for example, a mixing bake in block 50. In one embodiment, the mixing bake can include exposing the wafer 12 to a temperature of about 105 degrees C. to about 120 degrees C. for about sixty seconds to about seventy seconds. In some applications, it may be desirable to invoke a relatively large amount of reaction between the photo resist material and the coating 46 by using a mixing bake temperature at the upper end of the mixing bake temperature range (e.g., about 112 degrees C. (or higher) to about 120 degrees C.

As indicated, reaction of the coating 46 and the photo resist lines 40 can cause the reacted photo resist lines, or mask lines 26, to have an increased line width relative to the photo resist lines 40, resulting in a positive critical dimension change. For example, the mask lines 26 can have a critical dimension (L2 in FIG. 5) that is about 30 nanometers (nm) to about 60 nm larger than the original critical dimension L1 of the photo resist lines 40. In another embodiment, the critical dimension change can be about 50 nm to about 60 nm.

After the coating 46 has been reacted with the photo resist lines 40, any remaining unreacted coating 46 can be removed in block 52. For example, the unreacted portions of the coating 46 can be removed by rinsing the wafer 12. Rinse agents can include, for example, deionized (DI) water, DI water with a surfactant (e.g., a wetting agent), and DI water with alcohol (e.g., DI water with 10 percent isopropyl alcohol (IPA)).

After removal of the unreacted coating 46 (e.g., sometime referred to as developing the reacted coating and photo resist materials), another bake operation can be carried out in block 54. This bake, which will be referred to as a post development bake, can include exposing the wafer 12 to a temperature of about 90 degrees C. for about 70 seconds.

Figure 7:
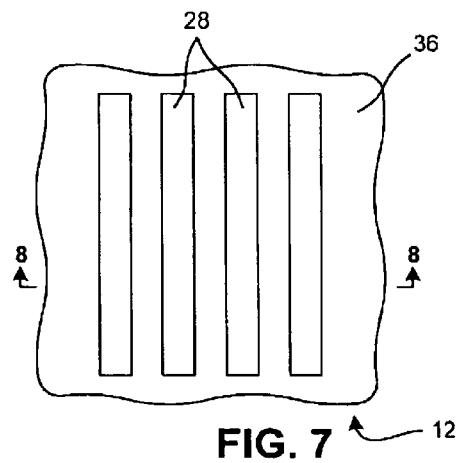
FIG. 7 is a schematic top view illustration of the wafer portion during yet another point in the wafer processing.
Figure 8:
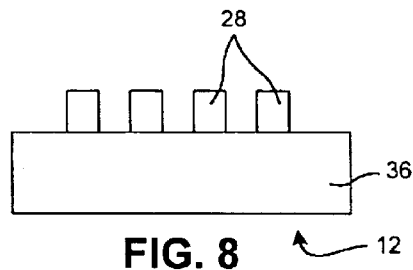
FIG. 8 is a cross-section taken along the line 8—8 of FIG. 7.

With continued reference to FIGS. 2, 7 and 8, the method can continue in block 56 where the underlying layer 34 can be etched using a suitable etch technique (e.g., a wet chemical etch or a dry reactive ion etch (REI)) to form the underlying layer lines 28. Thereafter, in block 58, the mask lines 40 and any other resist/coating structures formed over the underlying layer 34 can be removed through a cleaning process. Example suitable techniques for removing the mask lines 40 include dry ashing and/or wet stripping. For certain types of etch processes (block 56) and cleaning processes (block 58), cleaning may be carried out in situ in an etcher assembly in which the wafer 12 was etched in block 56.

Next, any appropriate additional processing to fabricate the IC (or ICs) from the wafer 12 can be carried out. Such additional processing can include, for example, depositing another layer over the patterned underlying layer 34 and processing that additional layer using the various lithographic techniques, including those described herein.

Various factors, or process parameters, associated with the method can be controlled to achieve a desired critical dimension L2 of the mask lines 26. For instance, the critical dimension L1 of the photo resist lines 40 and an amount of reaction with the coating 46 can be controlled to arrive at a desired critical dimension change from L1 to L2. The reaction with the coating 46 can be controlled using a variety of parameters, such as coating thickness, post application bake time and temperature, mixing bake time and temperature, post development bake time and temperature and so forth. In addition, during these bake operations, the photo resist material of the photo resist lines 40 may undergo a slight flowing that may effect the critical dimension L2. Any flowing of the resist material can be accounted for when establishing the process parameters.

It has now been appreciated that, by reacting the photo resist lines 40 with the coating 46 to form the mask lines 26, the mask lines 26 can have substantially less LER than the photo resist lines 40. The lower LER of the mask lines 26 can be transferred to the underlying layer 34 such that the underlying layer lines 28 exhibit an LER with acceptable parameters. This improvement in LER has been demonstrated in the fabrication of underlying layer lines 28 with a critical dimension of less than 0.25 microns. For example, lines with a critical dimension of about 0.06 micron can be formed with relatively low LER whereas, using conventional techniques, the LER of a 0.06 micron critical dimension line may be intolerable.

In one embodiment, the foregoing process parameters can be optimized to maximize the reduction of LER while minimizing critical dimension change. The improvement in LER from the photo resist lines 40 to the mask lines 26 can be dependent on the resist used and on the reaction of the coating with the resist. Determining the process parameters to establish repeatable results for the formation of any given structures can be achieved through empirical and/or calculated methods. In general, more reaction between the resist and the coating leads to higher improvement in LER as well as increases in critical dimension change. Therefore, these competing interests can be cooperatively optimized to avoid the need to print photo resist lines 40 that are narrower than desired.

Depending on the selection of various process parameters, the photo resist lines 40 may experience some line end growth when reacted with the coating 46. For example, the photo resist lines 40 may become longer by about 30 nm to about 50 nm at each end. Increases in line length or other behavioral changes in the line end(s) can be address by quantifying the line end behavior for the particular process and compensating for the changes in the reticle/mask layout using optical proximity correction (OPC). In general, OPC involves running a computer simulation that takes an initial reticle layout data set having information relating the desired pattern to be formed with the photo resist layer 32 and manipulates the data set to arrive at a corrected reticle layout data set in an attempt to compensate for various factors such as reticle/mask pattern fidelity, optical proximity effects within the exposure pattern 24 and photo resist processing.

The increase in photo resist line 40 critical dimension from L1 to L2 by reaction with a shrink coating can advantageously allow for the formation of relatively narrow lines with relatively low LER formed on the wafer 12 while using a lithographic process that employs small wavelength radiation (e.g., less than about 258 nm) and an ultra-thin resist (e.g., less than about 0.1 microns).

As one skilled in the art will appreciate, the example method described herein can be modified. For example, certain steps can be omitted, certain steps can be carried out concurrently, and other steps can be added.

Although particular embodiments of the invention have been described in detail, it is understood that the invention is not limited correspondingly in scope, but includes all changes, modifications and equivalents coming within the spirit and terms of the claims appended hereto.

What is claimed is:

1. A method of forming an integrated circuit line on a wafer using a lithographic technique, comprising;

providing the wafer, the wafer including a substrate and, over the substrate, each of a photo resist layer and an underlying layer to be processed under the photo resist layer;

exposing and developing the photo resist layer to form a photo resist line, the photo resist line having a line width smaller than a desired line width of the integrated circuit line;

coating the photo resist line with a reactive coating; and reacting the photo resist line with the coating to form a mask line having a line width corresponding to the desired line width of the integrated circuit line and with a smaller line edge roughness (LER) than of the photo resist line; and wherein a difference between a critical dimension of the photo resist line and a critical dimension of the mask line is about 30 nanometers to about 60 nanometers.

2. The method according to claim 1, further comprising etching the underlying layer using the mask line to define formation of the integrated circuit line from the underlying layer.

3. The method according to claim 2, wherein the integrated circuit line has a critical dimension of less than 0.25 microns.

4. The method according to claim 2, wherein the integrated circuit line has a critical dimension of about 0.06 microns or less.

5. A method of forming an integrated circuit line on a wafer using a lithographic technique, comprising;

providing the wafer, the wafer including a substrate and, over the substrate, each of a photo resist layer and an underlying layer to be processed under the photo resist layer;

exposing and developing the photo resist layer to form a photo resist line, the photo resist line having a line width smaller than a desired line width of the integrated circuit line;

coating the photo resist line with a reactive coating;

reacting the photo resist line with the coating to form a mask line having a line width corresponding to the desired line width of the integrated circuit line and with a smaller line edge roughness (LER) than of the photo resist line; and optimizing a change in critical dimension from the photo resist line to the mask line with an amount of LER improvement from the photo resist line to the mask line.

6. The method according to claim 5, wherein the optimizing includes at least one of selecting a material for the photo resist layer, controlling an exposure pattern to achieve a desired critical dimension of the photo resist line, and controlling an amount of reaction between the photo resist line and the coating.

7. The method according to claim 5, wherein the optimizing includes controlling an amount of reaction between the photo resist line and the coating.

8. The method according to claim 7, wherein the controlling includes at least one of controlling a coating thickness, controlling a post application bake time and temperature, controlling a mixing bake time and temperature, and controlling a post development bake time and temperature.

9. A method of forming an integrated circuit line on a wafer using a lithographic technique, comprising;
   providing the wafer, the wafer including a substrate and, over the substrate, each of a photo resist layer and an underlying layer to be processed under the photo resist layer;
   exposing and developing the photo resist layer to form a photo resist line, the photo resist line having a line width smaller than a desired line width of the integrated circuit line;
   coating the photo resist line with a reactive coating;
   reacting the photo resist line with the coating to form a mask line having a line width corresponding to the desired line width of the integrated circuit line and with a smaller line edge roughness (LER) than of the photo resist line; and
   accounting for changes in an end of the photo resist line caused by reaction with the coating using optical proximity correction.

10. The method according to claim 1, wherein the coating is a shrink coating.

11. The method according to claim 1, wherein the reacting includes exposing the wafer to a temperature of about 105 degrees C. to about 120 degrees C. for about sixty seconds to about seventy seconds.

12. The method according to claim 1, wherein the reacting includes exposing the wafer to a temperature of about 112 degrees C. to about 120 degrees C.

13. The method according to claim 1, further comprising, after reacting, rinsing the wafer with one of deionized water, deionized water and a surfactant, deionized water and isopropyl alcohol, and mixtures thereof.

14. The method according to claim 1, wherein the integrated circuit line is a conductive line used to form at least one gate electrode or an addressable word line.

* * * * *